United States Patent [19]
Hirata et al.

[11] Patent Number: 6,137,306
[45] Date of Patent: Oct. 24, 2000

[54] INPUT BUFFER HAVING ADJUSTMENT FUNCTION FOR SUPPRESSING SKEW

[75] Inventors: Takashi Hirata, Neyagawa; Toru Iwata, Osaka, both of Japan

[73] Assignee: Matsushita Electric Industrial Co., Ltd., Osaka, Japan

[21] Appl. No.: 09/345,012

[22] Filed: Jul. 2, 1999

[30] Foreign Application Priority Data

Jul. 7, 1998 [JP] Japan .................................. 10-192154

[51] Int. Cl.$^7$ .................................................. H03K 17/16
[52] U.S. Cl. .............................. 326/26; 326/22; 327/74; 327/75
[58] Field of Search .......................... 326/22, 26, 82; 327/50, 71, 74, 75, 90, 407

[56] References Cited

U.S. PATENT DOCUMENTS

| | | | |
|---|---|---|---|
| 4,424,458 | 1/1984 | Buck et al. | 327/75 |
| 4,682,052 | 7/1987 | Kyomasu | 327/75 |
| 5,349,246 | 9/1994 | McClure | 326/22 |
| 5,642,063 | 6/1997 | Lehikoinen | 327/74 |
| 5,703,505 | 12/1997 | Kwon | 327/99 |
| 5,990,700 | 11/1999 | Park | 326/22 |

FOREIGN PATENT DOCUMENTS 08274597 10/1996 Japan .

*Primary Examiner*—Tan T. Nguyen
*Attorney, Agent, or Firm*—Renner, Otto, Boisselle & Sklar LLP

[57] ABSTRACT

An input buffer of the present invention includes: a plurality of receiver circuits for performing different phase adjustments on an input signal, and outputting the differently phase-adjusted signals; a pattern detection circuit for detecting a period of time for which a voltage of the input signal has remained unchanged; and a signal selection circuit for selecting one of the output signals received from the receiver circuits based on the detection result from the pattern detection circuit.

6 Claims, 9 Drawing Sheets

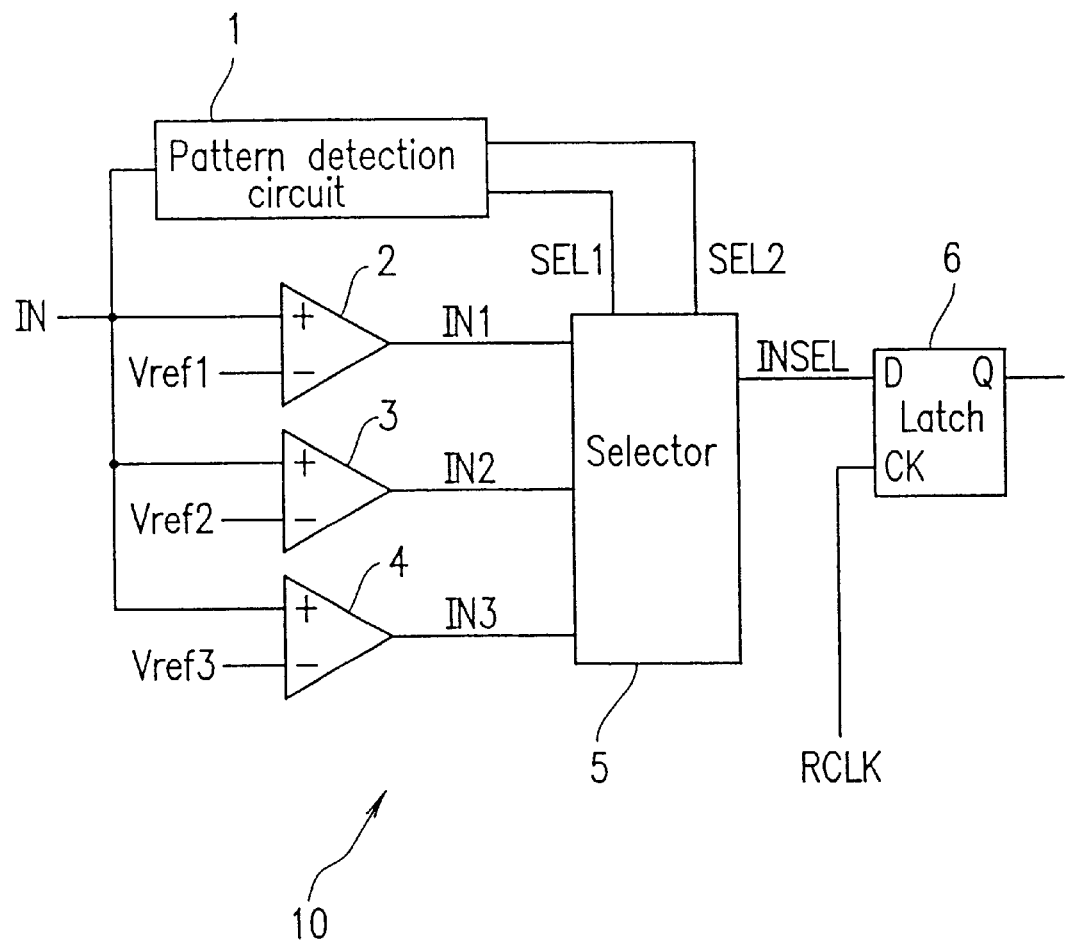

FIG.4B

| SEL1 | SEL2 | Selection circuit |
|------|------|-------------------|
| L    | L    | IN1               |
| H    | L    | IN2               |
| L    | H    | IN3               |

FIG.5B

| SEL1 | SEL2 | Selection circuit |
|---|---|---|
| L | L | DL1 |
| H | L | DL2 |
| L | H | DL3 |

6,137,306

INPUT BUFFER HAVING ADJUSTMENT FUNCTION FOR SUPPRESSING SKEW

BACKGROUND OF THE INVENTION

1. Field of the Invention

The present invention relates to a semiconductor integrated circuit and, more particularly, to an input buffer circuit and a control circuit therefor.

2. Description of the Related Art

As the rate for transferring data between semiconductor chips has increased, the problem of a skew occurring between a clock signal and a data signal has become more pronounced. The term "skew" as used herein refers to an asynchronism between/among bits which are read out in parallel. Usually, when there is a skew between a clock signal and a data signal, there is also a skew between two data signals. Accurate data transfer cannot be accomplished with such a skew.

Typically, in applications where high-speed data transfer is required, the signal output timing is adjusted by using DLL (Delay Lock Loop), PLL (Phase Lock Loop), or the like for suppressing a skew due to a phase difference among a number of signals. By the use of such an output timing adjustment, data signals and a clock signal will be in phase with one another, thereby suppressing the skew due to phase difference among the signals.

In other applications where the data transfer rate is even higher, however, there arises another problem; that is, a skew between two signals which occurs when the periods of time, in which the signals change from one state to another, i.e., the transition times of the signals, differ from each other because the signals have been continuously at the same voltage (or logical) level for different periods of time. The longer a signal remains at the same level, the longer the driver for outputting the signal takes for driving the signal, whereby the transition time of the signal is also longer.

Therefore, when a data signal changes from a first data value to a second data value after successive occurrences of the first data value, the transition time of the data signal is relatively long. On the other hand, the transition time of a data signal is relatively short after the data value of the data signal changes successively. Thus, the transition time of a data signal after successive occurrences of the same data value is different from that after successive changes in data value. When two or more data signals have different transition times due to the difference in the period of time for which the same data value has occurred continuously, a skew occurs between the data signals.

FIG. 4 shows a skew occurring between two data signals D1 and D2 while they are transferred between chips. The data signals D1 and D2 have different transition times due to the difference in the period of time for which the same data value has occurred continuously. As shown in FIG. 6, the signals D1 and D2 both rise from an L level to an H level at time T1. The term "H level" as used herein refers to a relatively high signal voltage, and corresponds to the larger logical value in a binary expression, whereas the "L level" as used herein refers to a relatively low signal voltage, and corresponds to the smaller logical value in the binary expression.

Referring to FIG. 6, the data signal D1 rises at T1 from the L level to the H level after successive occurrences of the L level data value. The data signal D2 similarly rises at T1 from the L level to the H level, but after successive changes in data value. Even if the signals D1 and D2 are controlled to start rising at the same time (e.g., time T1) by the output timing adjustment (e.g., an ON/OFF timing adjustment of the driver), there is a difference TSK between the times at which the signals D1 and D2 respectively reach a reference potential Vref.

Still referring to FIG. 6, the data signal D2 changes at time T0 corresponding to the rising edge of the clock CLK, and changes again immediately at time T1 corresponding to the falling edge of the clock CLK. In such a case, if the frequency of the clock CLK is as high as about 100 MHz, for example, the data signal D2 starts transiting to the next data value (a voltage value VH corresponding to the H level), before it reaches a voltage value VL corresponding to the L level. Thus, there occurs a difference dV between the data signal D2 at time T1 and the voltage value VL corresponding to the L level. Due to the difference dV, there occurs the difference TSK between the times at which the signals D1 and D2 respectively reach the reference potential level Vref (Vref is used by the data receiving side for detecting whether the signal is at the H level or at the L level).

Thus there occurs a skew between the data signals D1 and D2 due to the rising time difference TSK between the signals. This problem of the skew occurring due to the difference TSK is more pronounced as the frequency of the clock CLK increases (e.g., to about 100 MHz).

While the former type of skew, which occurs due to the phase difference among a number of signals (e.g., 8 bits), can be suppressed by the above-described output timing adjustment, the latter type of skew, which occurs due to the difference in the transition time resulting from the difference in the period of time for which the signal voltage has remained unchanged, cannot be suppressed by the prior art.

SUMMARY OF THE INVENTION

According to one aspect of this invention, an input buffer includes: a plurality of receiver circuits for performing different phase adjustments on an input signal, and outputting the differently phase-adjusted signals; a pattern detection circuit for detecting a period of time for which a voltage of the input signal has remained unchanged; and a signal selection circuit for selecting one of the output signals received from the receiver circuits based on the detection result from the pattern detection circuit.

In one embodiment of the invention, the different phase adjustments are performed by comparing the voltage of the input signal with different reference potentials which are provided for the respective receiver circuits.

In one embodiment of the invention, the different phase adjustments are performed by delaying the input signal by different periods of time which are provided for the respective receiver circuits.

In one embodiment of the invention, the pattern detection circuit includes: a buffer circuit for amplifying the input signal and outputting the amplified signal; and a level detection circuit for detecting a potential level of the output from the buffer circuit and outputting the detection result.

In one embodiment of the invention, the voltage of the input signal varies between an H level voltage and an L level voltage which is lower than the H level voltage. The signal selection circuit selects one of the output signals received from the receiver circuits, which is adjusted so that the signal transits from an H level to an L level in a shorter period of time, when a period of time for which the voltage of the input signal has been continuously at the H level is longer than a first predetermined period. The signal selection circuit selects one of the output signals received from the receiver circuits, which is adjusted so that the signal transits from the L level to the H level in a shorter period of time, when a period of time for which the voltage of the input signal has been continuously at the L level is longer than a second predetermined period.

In one embodiment of the invention, each of the first and second predetermined periods is determined based on a minimum transition period of a logical value of the input signal.

Thus, the invention described herein makes possible the advantage of suppressing a skew which occurs due to a transition time difference resulting from a difference in the period of time for which a signal voltage has remained unchanged.

This and other advantages of the present invention will become apparent to those skilled in the art upon reading and understanding the following detailed description with reference to the accompanying figures.

BRIEF DESCRIPTION OF THE DRAWINGS

FIG. 1A is a block diagram illustrating an input buffer having an adjustment function for suppressing a skew according to Embodiment 1 of the present invention;

FIG. 4B illustrates the correspondence between the values of the select signals and the signal selected by the selector according to Embodiment 1 of the present invention;

FIG. 5B illustrates the correspondence between the values of the select signals and the signal selected by the selector according to Embodiment 2 of the present invention.

DESCRIPTION OF THE PREFERRED EMBODIMENTS

Figure 1B:
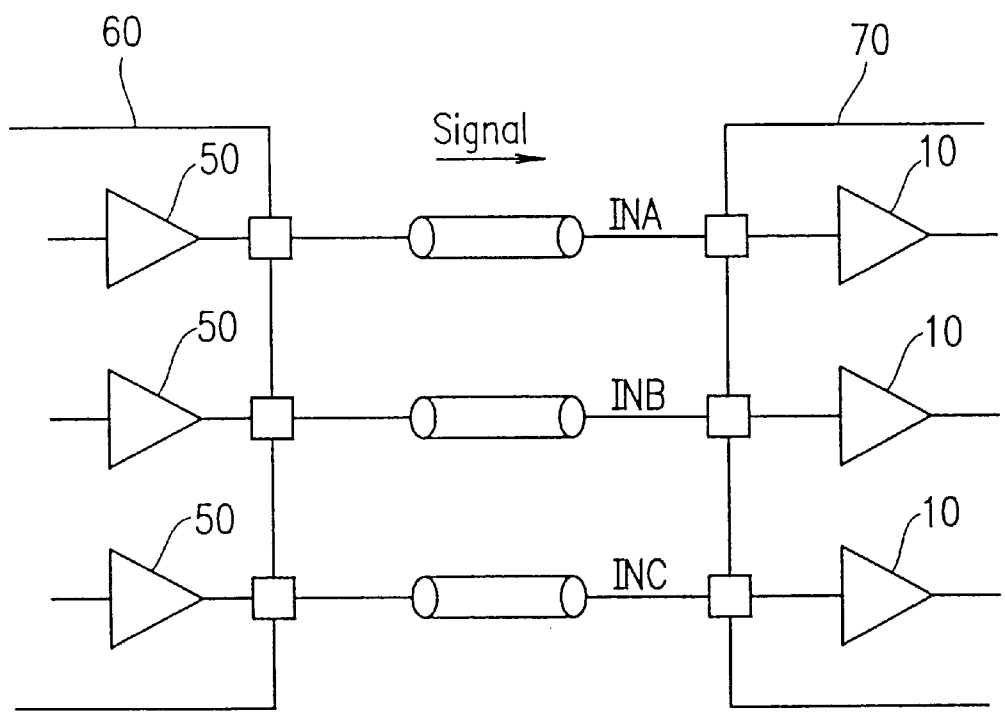
FIG. 1B illustrates a configuration of an IC chip including a number of input buffers according to Embodiment 1 of the present invention.

First, the general principle of the present invention will be described.

An input buffer of the present invention includes a pattern detection circuit, a plurality of receiver circuits, and a signal selection circuit. An input signal to the input buffer is input to the plurality of receiver circuits and to the pattern detection circuit. The respective receiver circuits perform different phase adjustments on the input signal, and output the differently phase-adjusted signals to the signal selection circuit. The pattern detection circuit detects the period of time for which the voltage of the input signal has remained unchanged, and outputs the detection result to the signal selection circuit. The signal selection circuit selects one of the output signals received from the receiver circuits based on the detection result from the pattern detection circuit, and outputs the selected signal as an output signal of the input buffer.

As a result, the phase adjustment performed by the input buffer on an input signal thereto can be appropriately varied according to the period of time for which the voltage of the input signal has remained unchanged.

Hereinafter, preferred embodiments of the present invention will be described with reference to the figures.

Embodiment 1

FIG. 1A is a block diagram illustrating an input buffer 10 having a skew suppressing function according to Embodiment 1 of the present invention. The input buffer 10 includes a pattern detection circuit 1, receiver circuits 2, 3 and 4, a selector circuit 5, and a latch circuit 6.

The input buffer 10 receives an input signal IN through the receiver circuits 2, 3 and 4. The receiver circuits 2, 3 and 4 receive reference potentials Vref1, Vref2 and Vref3, respectively. The receiver circuits 2, 3 and 4 respectively output signals IN1, IN2 and IN3, each of which is an L level signal or an H level signal depending upon whether the input signal exceeds the respective one of the reference potentials Vref1, Vref2 and Vref3. In particular, each of the receiver circuits 2, 3 and 4 outputs an H level signal when the input signal exceeds the respective reference potential, and otherwise outputs an L level signal.

The pattern detection circuit 1 of the input buffer 10 detects the period of time for which the input signal has been continuously at the H or L level (hereinafter, referred to also as the "continuity" or the "pattern" of the input signal). The pattern detection circuit 1 outputs select signals SEL1 and SEL2 which indicate the detection result.

The selector 5 selects one of the output signals IN1, IN2 and IN3 received respectively from the receiver circuits 2, 3 and 4 based on the select signals SEL1 and SEL2 from the pattern detection circuit 1. The signal selected by the selector 5 is output as an output signal INSEL of the input buffer 10.

While FIG. 1A illustrates an example where a 1-bit signal is received, the present invention can also be used in a case where a signal of a number of bits is received, as illustrated in FIG. 1B.

FIG. 1B illustrates a configuration of an IC chip using a number of the input buffers 10 for sending/receiving a number of bits of signals. A number of input buffers 10 as illustrated in FIG. 1A are incorporated in a chip 70. Referring to FIG. 1B, a number of bits (e.g., 8 bits, or 3 bits as in the illustrated example) of signals INA, INB and INC are sent in parallel from output buffers 50 which are incorporated in another chip 60, and the input buffers 10 receive the signals INA, INB and INC via cables, lines wired on a printed circuit board, or the like. The three bits of signals INA, INB and INC output from the output buffers 50 may have different patterns. Then, even if the signals INA, INB and INC are sent from the output buffers 50 at the same time, there occurs the latter type of skew which depends upon the patterns of the data signals received by the input buffers 10.

Where data is received with a single clock signal, if the clock frequency is high (e.g., about 100 MHz), it is likely that signals are received with errors due to the possible skew. This is also true in the case of sending/receiving a single bit signal, as illustrated in FIG. 1A. That is, in the case where a single bit signal IN is sent/received, as illustrated in FIG.

1A, if the clock frequency is high (e.g., about 100 MHz), it is likely that a signal is received with an error due to the possible skew.

Figure 2:
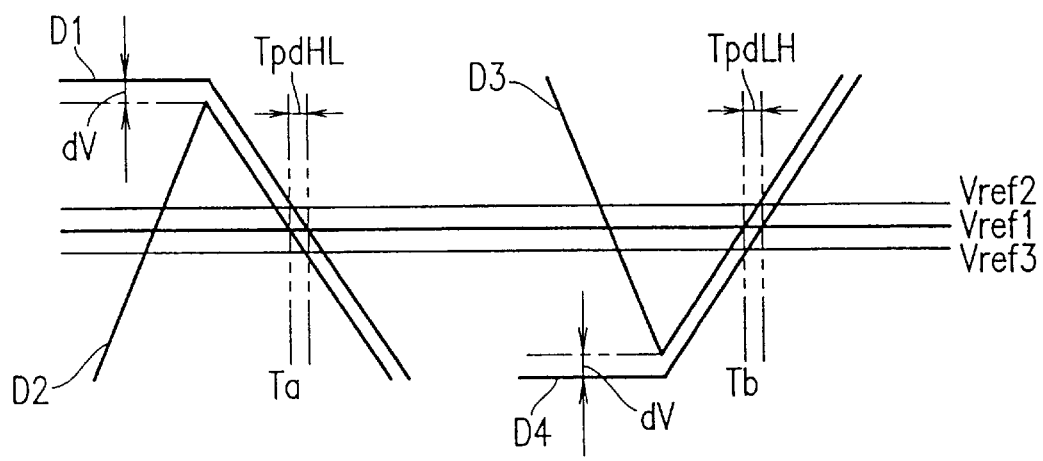
FIG. 2 illustrates how the signal detection timing changes when the reference potential is varied according to Embodiment 1 of the present invention.

FIG. 2 illustrates how the signal detection timing changes when the reference potential of the input buffer 10 is varied among Vref1, Vref2 and Vref3. In the following description, Vref1 refers to the normal reference potential, Vref2 refers to another reference potential which is higher than Vref1, and Vref3 refers to sill another reference potential which is lower than Vref1. Referring to FIG. 2, a case where the input signal IN (data signal D1 or D2) to the input buffer 10 falls from the H level to the L level will be discussed.

The data signal D1 falls to the L level after being at the H level for a period of time which is equal to or greater than a first predetermined period, whereas the data signal D2 falls to the L level immediately after rising from the L level to the H level.

When the input buffer 10 receives the data signals D1 and D2 using the normal reference potential Vref1, there occurs a time delay TpdHL between the falling of the data signal D1 and that of the data signal D2. However, by receiving the data signal D1 using Vref2 while receiving the data signal D2 using Vref1, the falling of the data signal D1 and that of the data signal D2 are detected at the same timing Ta.

Next, referring to FIG. 2, a case where the input signal IN (data signal D3 or D4) to the input buffer 10 rises from the L level to the H level will be discussed.

The data signal D3 rises from the L level to the H level immediately after falling from the H level to the L level, whereas the data signal D4 rises from the L level to the H level after being at the L level for a period of time which is equal to or greater than a second predetermined period.

When the input buffer 10 receives the data signals D3 and D4 using the normal reference potential Vref1, there occurs a time delay TpdLH between the rising of the data signal D3 and that of the data signal D4. However, by receiving the data signal D3 using Vref1 while receiving the data signal D4 using Vref3, the rising of the data signal D3 and that of the data signal D4 are detected at the same timing Tb.

Thus, the time delay TpdLH or TpdHL can be corrected or substantially eliminated by detecting the "continuity" of the input signal by the pattern detection circuit 1 of the input buffer 10 and then varying the reference potential based on the detection result. In this way, it is possible to suppress the skew which occurs due to the time delay TpdLH or TphHL.

Each of the first and second predetermined periods as described above may be determined based on, for example, the minimum transition period of the logical value of the input signal IN, which corresponds to a period of time Tmin between adjacent rising and falling edges of a clock signal RCLK, which will be described later with reference to FIG. 4A. The first and second predetermined periods may either be the same or different from each other.

Figure 3:
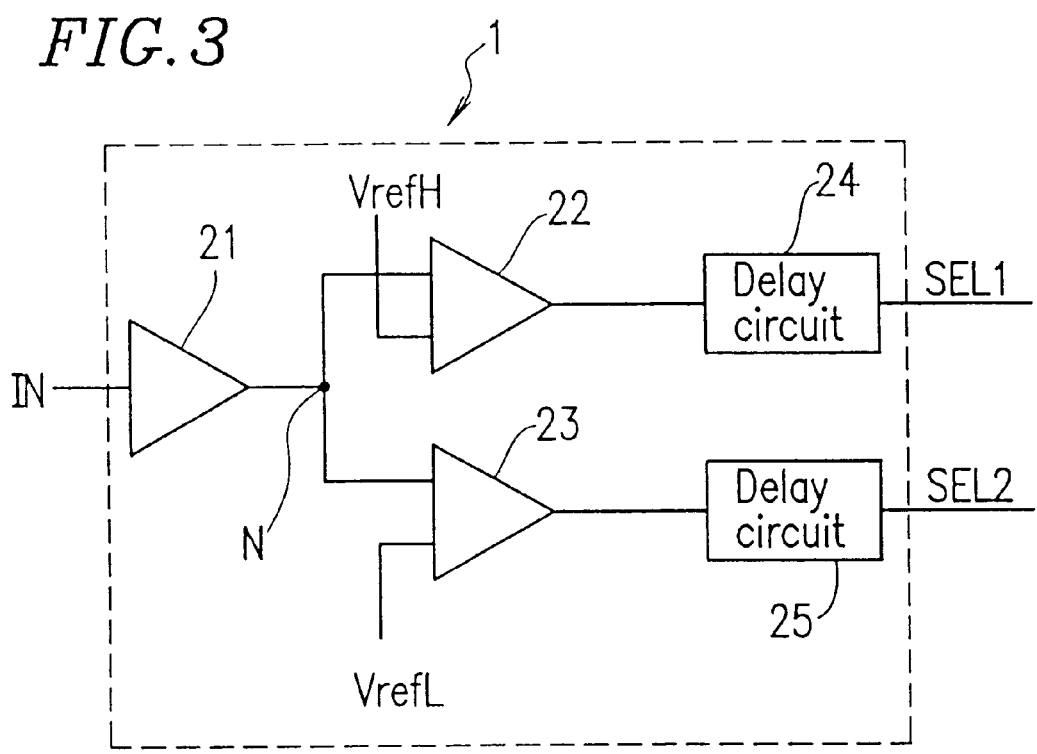
FIG. 3 illustrates a configuration of a pattern detection circuit provided on the input buffer of the present invention.

FIG. 3 illustrates a configuration of a pattern detection circuit 1 provided in the input buffer 10. The pattern detection circuit 1 includes a buffer circuit 21, a node N, differential amplifiers 22 and 23, and delay circuits 24 and 25.

The pattern detection circuit 1 receives an input signal IN. The buffer circuit 21 amplifies the input signal IN and outputs the amplified signal. There is a parasitic capacitance between the buffer circuit 21 and the node N.

The differential amplifiers 22 and 23 output signals to the delay circuits 24 and 25, respectively, according to a potential CIN at the node N. The differential amplifier 22 compares the potential CIN at the node N with a reference potential VrefH, and outputs the comparison result to the delay circuit 24. The differential amplifier 23 compares the potential CIN at the node N with a reference potential VrefL, and outputs the comparison result to the delay circuit 25. The reference voltage VrefH is higher than another reference potential VrefL.

Specifically, the differential amplifier 22 outputs an H level signal, as a signal indicating the comparison result, if the potential CIN at the node N is higher than the reference voltage VrefH, while outputting an L level signal, as a signal indicating the comparison result, if the potential CIN at the node N is not higher than the reference voltage VrefH. The differential amplifier 23 outputs an H level signal, as a signal indicating the comparison result, if the potential CIN at the node N is lower than the reference voltage VrefL, while outputting an L level signal, as a signal indicating the comparison result, if the potential CIN at the node N is not lower than the reference voltage VrefL.

Figure 4A:
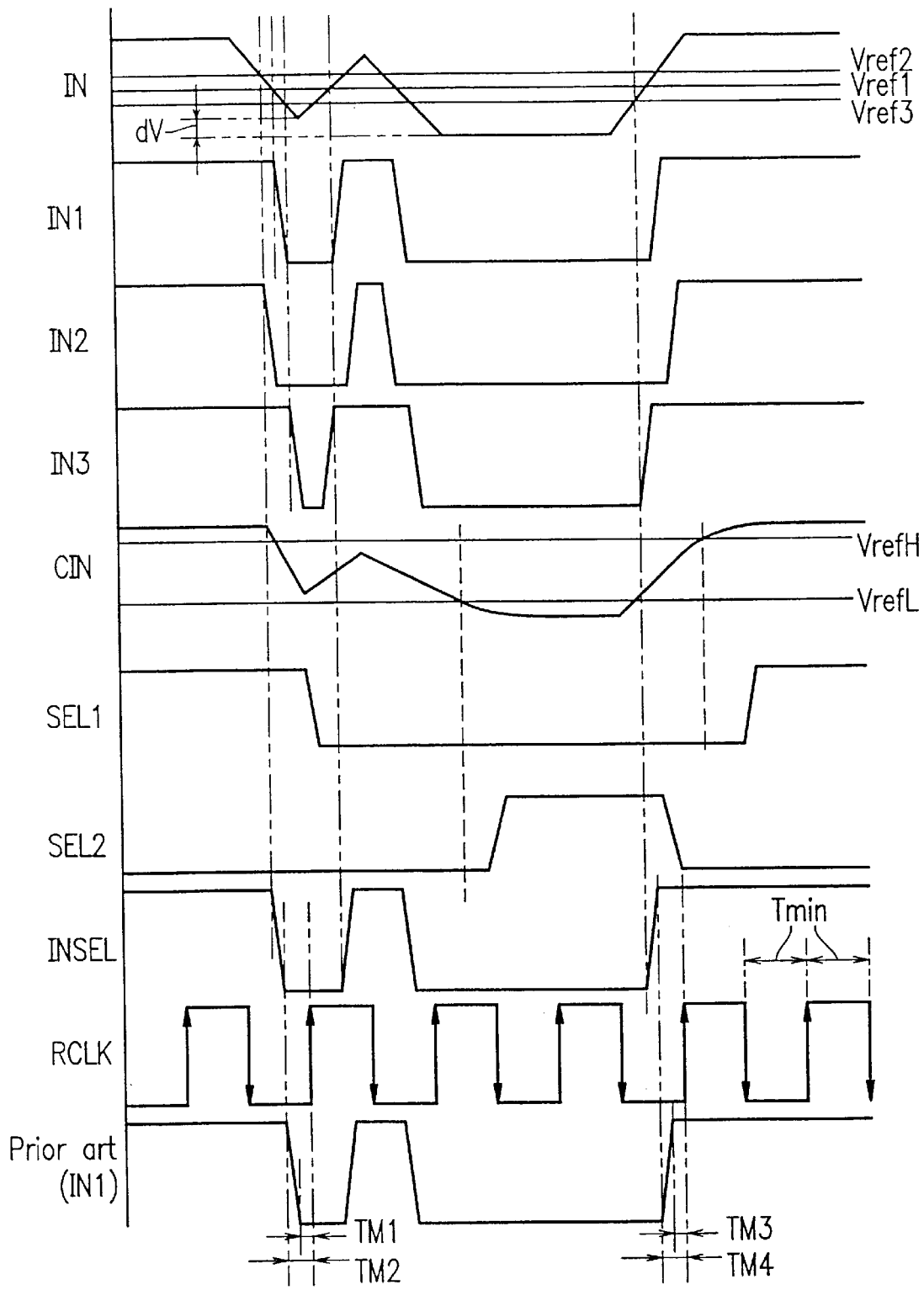
FIG. 4A illustrates operating timings of the pattern detection circuit according to Embodiment 1 of the present invention.

FIG. 4A illustrates operating timings of respective nodes of the input buffer 10 which is provided with the skew suppressing function according to Embodiment 1 of the present invention. Referring to FIG. 4A, the operation at each node of the pattern detection circuit 1 will be described below.

FIG. 4A illustrates: the input signal IN to the input buffer 10; the output signals IN1, IN2 and IN3 from the receiver circuits 2, 3 and 4, respectively; the voltage waveform CIN at the node N of the pattern detection circuit 1, as illustrated in FIG. 3; the output signal SEL1 from the delay circuit 24 of the pattern detection circuit 1; the output signal SEL2 of the delay circuit 25; the output signal INSEL from the selector 5; and the operating timing of the clock signal RCLK based on which data is received. The operation of the pattern detection circuit 1 will be discussed below assuming that the input signal IN changes as illustrated in FIG. 4A.

Referring to FIG. 3, the input buffer 10 receives the input signal IN at the receiver circuits 2, 3 and 4, and outputs signals IN1–IN3 based on the reference potentials Verf1–Verf3, respectively. Each of the receiver circuits 2, 3 and 4 outputs a logical value which corresponds to the "H level" when the input signal IN exceeds respective one of the reference potentials Vref1–Vref3. Each of the receiver circuits 2, 3 and 4 outputs a logical value which corresponds to the "L level" when the input signal IN falls below respective one of the reference potentials Vref1–Vref3.

The pattern detection circuit 1 receives the input signal at the differential amplifiers 22 and 23. The differential amplifier 22 outputs a high logical value which corresponds to an H level signal when the input signal exceeds the reference voltage VrefH. The differential amplifier 23 outputs a high logical value which corresponds to an H level signal when the input signal falls below the reference voltage VrefL.

Each of the delay circuits 24 and 25 delays an output signal from respective one of the differential amplifiers 22 and 23 by about one half of a cycle of the clock signal RCLK, and outputs the delayed signals SEL1 and SEL2 to the selector 5.

The selector 5 selects one of the output signals IN1–IN3 received respectively from the receiver circuits 2–4 based on a logical value corresponding to the combination of the values of the output signals SEL1 and SEL2, and outputs the signal INSEL based on the selection result. The latch circuit 6 latches the output signal INSEL based on the clock signal RCLK, based on which data is received.

By employing the above-described method, a longer period of time can be assigned for the interval from the time at which the received data is determined until the time at which the received data is latched in synchronism with the clock signal RCLK, than that which can be assigned in the conventional method where data is received based on a single reference potential. Referring to FIG. 4A, the interval from the time at which the received data is determined until the time at which the received data is latched in synchronism with the clock signal RCLK according to the conventional method is denoted by TM1 and TM3, and the interval according to this embodiment of the present invention is denoted by TM2 and TM4. Thus, according to the present embodiment, it is possible to provide a large margin for such an interval.

Therefore, in the case of a higher frequency as described above or in the case where a skew occurs due to noise, mislatch of data is less likely to occur than in the prior art.

While the received data is latched in synchronism with the rising edge of the clock signal RCLK in the illustrated example, the present invention is not limited thereto. The received data may be latched in synchronism with the falling edge of the clock signal RCLK. Moreover, the received data may be latched in synchronism with each of the rising and falling edges of the clock signal RCLK.

As described above, the selector 5 selects and outputs one of the output signals IN1, IN2 and IN3 according to the combination of values of the select signals SEL1 and SEL2.

FIG. 4B illustrates the correspondence between the values of the select signals SEL1 and SEL2 and the signal selected by the selector 5. In FIG. 4B, the signal selected by the selector 5 is shown in the "Selection circuit" column. Referring to FIG. 4B, the selector 5 selects the signal IN1 when the select signals SEL1 and SEL2 are both at the L level; the signal IN2 when the select signals SEL1 and SEL2 are at the H level and at the L level, respectively; and the signal IN3 when the select signals SEL1 and SEL2 are at the L level and at the H level, respectively. Practically, the select signals SEL1 and SEL2 will not be both at the H level.

Thus, the reference potential can be substantially varied by detecting the "continuity" of the input signal by the pattern detection circuit 1 of the input buffer 10 and selecting the output signal INSEL based on the detection result. In this way, it is possible to correct or substantially eliminate the time delay TpdLH or TpdHL which occurs due to the difference in the "continuity" therebetween, and thus to suppress the skew which occurs due to the time delay TpdLH or TpdHL.

While the number of receiver circuits provided is the input buffer 10 is three in the above-described embodiment of the present invention, the number is not limited to three. When the number of receiver circuits provided in the input buffer is other than three, the present invention can be similarly implemented by providing that same number of "continuities" or "patterns" of input signals to be detected by the pattern detection circuit.

Moreover, the time or timing at which the potential CIN at the node N in the pattern detection circuit 1 changes can be adjusted by varying the current driving capability of the buffer circuit 21. When the current driving capability of the buffer circuit 21 can be varied by an external signal, it is possible to accommodate the change in the power supply voltage of the input buffer 10 and the variations in the production process therefor.

Furthermore, the value of each of the reference potentials Vref1, Vref2 and Vref3 can be determined by sending a test signal to the input buffer 10. In this way, it is possible to accommodate the variations in the production process for the input buffer 10 and the skew which occurs due to the difference in the condition under which the input buffer 10 is used.

Embodiment 2

Figure 5A:
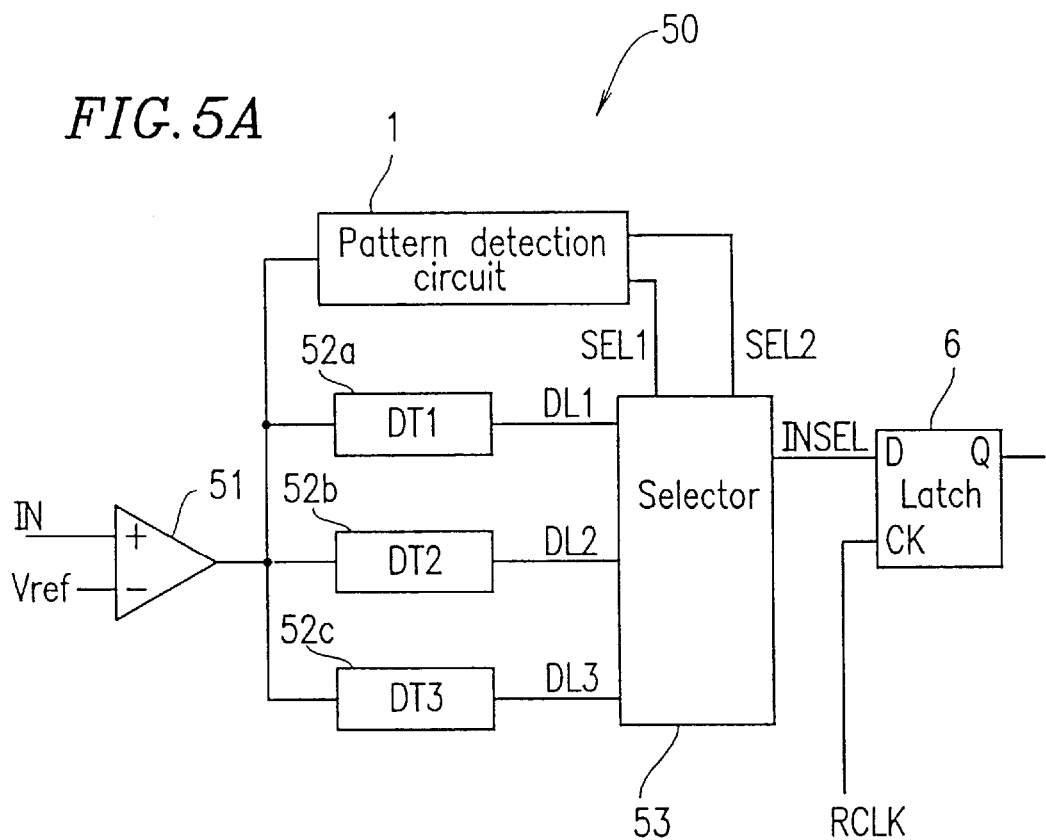
FIG. 5A is a block diagram illustrating an input buffer having an adjustment function for suppressing a skew according to Embodiment 2 of the present invention.
Figure 6:
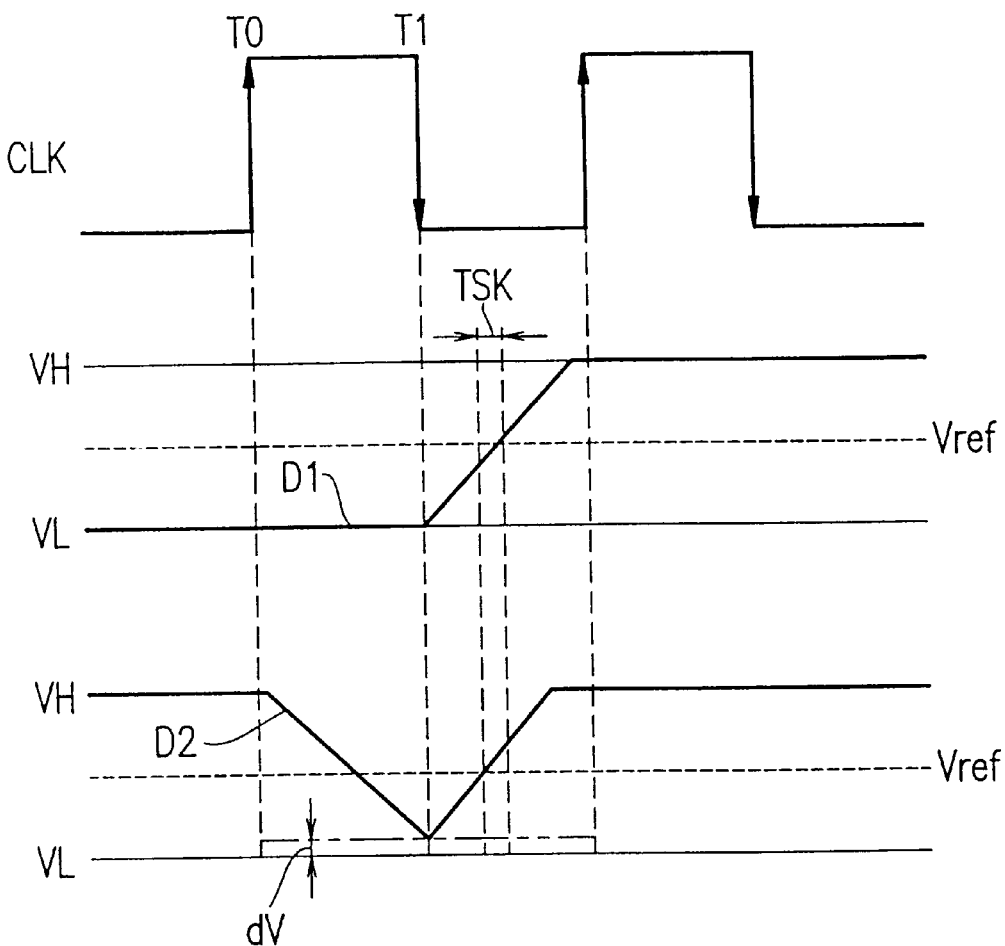
FIG. 6 shows a skew occurring between two data signals transferred between chips due to the difference therebetween in the data transition time depending upon the timing at which the signal is determined.

FIG. 5A is a block diagram illustrating an input buffer 50 having a phase adjustment function for suppressing a skew according to Embodiment 2 of the present invention. The input buffer 50 includes a pattern detection circuit 1, a receiver 51, delay circuits 52a, 52b and 52c, a selector 53 and a latch circuit 6.

The input buffer 50 receives the input signal IN at the receiver 51. A reference potential Vref is also input to the receiver 51. The receiver 51 outputs an H level signal when the input signal exceeds the reference potential Vref, and an L level signal when the input signal does not exceed the reference potential Vref. The signal output from the receiver 51 is input to the pattern detection circuit 1, and the delay circuits 52a, 52b and 52c.

The delay circuit 52a and the receiver 51 together form a first receiver circuit. The delay circuit 52b and the receiver 51 together form a second receiver circuit. The delay circuit 52c and the receiver 51 together form a third receiver circuit. Thus, the receiver 51 is shared by a number of receiver circuits, though the present invention is not limited thereto. Alternatively, the receiver 51 may be provided for each of the receiver circuits.

The input buffer 50 detects the "continuity" of the input signal by the pattern detection circuit 1. The pattern detection circuit 1 outputs the detection result to the selector 53 as select signals SEL1 and SEL2. The pattern detection circuit 1 operates in the manner as described above in Embodiment 1.

Each of the delay circuits 52a, 52b and 52c delays the signal received from the receiver 51 by the respective one of the predetermined periods, and outputs the delayed signal as respective one of output signals DL1, DL2 and DL3. The delay circuit 52a delays the signal received from the receiver 51 by a time delay DT1, and outputs the delayed signal as the output signal DL1. The delay circuit 52b delays the signal received from the receiver 51 by a time delay DT2, and outputs the delayed signal as the output signal DL2. The delay circuit 52c delays the signal received from the receiver 51 by a time delay DT3, and outputs the delayed signal as the output signal DL3. The time delays DT1, DT2 and DT3 are preferably different from one another; and preferably, DT1>DT2 and DT1>DT3.

The selector 53 selects one of the output signals DL1, DL2 and DL3 received respectively from the delay circuits 52a, 52b and 52c according to the combination of the values of the select signals SEL1 and SEL2 received from the pattern detection circuit 1. The signal selected by the selector 53 is output as the output signal INSEL of the input buffer 50.

FIG. 5B illustrates the correspondence between the values of the select signals SEL1 and SEL2 and the signal selected by the selector 53. In FIG. 5B, the signal selected by the selector 53 is shown in the "Selection circuit" column. Referring to FIG. 5B, the selector 53 selects the signal DL1 when the select signals SEL1 and SEL2 are both at the L level; the signal DL2 when the select signals SEL1 and SEL2 are at the H level and at the L level, respectively; and the signal DL3 when the select signals SEL1 and SEL2 are at the L level and at the H level, repectively. Practically, the select signals SEL1 and SEL2 will not be both at the H level.

Thus, the time delay to be added to the input signal IN can be substantially varied by detecting the "continuity" of the input signal by the pattern detection circuit 1 of the input buffer 50 and selecting the output signal INSEL based on the detection result. In this way, it is possible to correct or substantially eliminate the time delay TpdLH or TpdHL described above in Embodiment 1, and thus to suppress the skew which occurs due to the time delay TpdLH or TpdHL.

While the number of delay circuits provided in the input buffer 50 is three in the above-described embodiment of the present invention, the number is not limited to three. When the number of delay circuits provided in the input buffer in other than three, the present invention can be similarly implemented by providing that same number of "continuities" or "patterns" of input signals to be detected by the pattern detection circuit. In order to detect more finely defined "continuities" or "patterns" of input signals and to control the time delay more finely, an accordingly larger number of delay circuits can be provided. Moreover, when the time delays TpdLH and TpdHL are substantially equal to each other, two delay circuit may be sufficient.

Furthermore, the time or timing at which the potential CIN at the node N in the pattern detection circuit 1 changes can be adjusted by varying the current driving capability of the buffer circuit 21, as in Embodiment 1.

Moreover, the value of each of the time delays DL1, DL2 and DL3 can be determined by sending a test signal to the input buffer 50. In this way, it is possible to accommodate the variations in the production process for the input buffer 50 and the skew which occurs due to the difference in the conditions under which the input buffer 50 is used.

As described above, the input buffer of the present invention includes a plurality of receiver circuits for performing different phase adjustments on the input signal, and outputting the differently adjusted signals, a pattern detection circuit for detecting the period of time for which the voltage of the input signal has remained unchanged, and a signal selection circuit for selecting one of the output signals received from the receiver circuits based on the detection result from the pattern detection circuit. Thus, the input buffer of the present invention can perform different phase adjustments on the input signal according to the period of time for which the voltage of the input signal has remained unchanged. As a result, it is possible to correct or substantially eliminate the time delay between two rising or falling input signals which occurs due to the difference in the "continuity" therebetween, and thus to suppress the skew between the input signals.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An input buffer, comprising:

a plurality of receiver circuits for performing different phase adjustments on an input signal, and outputting the differently phase-adjusted signals;

a pattern detection circuit for detecting a period of time for which a voltage of the input signal has remained unchanged; and a signal selection circuit for selecting one of the output signals received from the receiver circuits based on the detection result from the pattern detection circuit.

2. An input buffer according to claim 1, wherein the different phase adjustments are performed by comparing the voltage of the input signal with different reference potentials which are provided for the respective receiver circuits.

3. An input buffer according to claim 1, wherein the different phase adjustments are performed by delaying the input signal by different periods of time which are provided for the respective receiver circuits.

4. An input buffer according to claim 1, wherein the pattern detection circuit comprises:

a buffer circuit for amplifying the input signal and outputting the amplified signal; and a level detection circuit for detecting a potential level of the output from the buffer circuit and outputting the detection result.

5. An input buffer according to claim 1, wherein:

the voltage of the input signal varies between an H level voltage and an L level voltage which is lower than the H level voltage;

the signal selection circuit selects one of the output signals received from the receiver circuits, which is adjusted so that the signal transits from an H level to an L level in a shorter period of time, when a period of time for which the voltage of the input signal has been continuously at the H level is longer than a first predetermined period; and the signal selection circuit selects one of the output signals received from the receiver circuits, which is adjusted so that the signal transits from the L level to the H level in a shorter period of time, when a period of time for which the voltage of the input signal has been continuously at the L level is longer than a second predetermined period.

6. A input buffer according to claim 1, wherein each of the first and second predetermined periods is determined based on a minimum transition period of a logical value of the input signal.

* * * * *